United States Patent
Yossef

(10) Patent No.: US 9,871,701 B2
(45) Date of Patent: Jan. 16, 2018

(54) ENDPOINT MAPPING IN A COMMUNICATION SYSTEM USING SERIAL SIGNAL SENSING

(71) Applicant: HCS KABLOLAMA SISTEMLERI SANAYI VE TICARET A.S., Istanbul (TR)

(72) Inventor: Shay Yossef, Moshav Maor (IL)

(73) Assignee: HCS KABLOLAMA SISTEMLERI SANAYI VE TICARET A.S., Istanbul (TR)

( * ) Notice: Subject to any disclaimer, the term of this patent is extended or adjusted under 35 U.S.C. 154(b) by 238 days.

(21) Appl. No.: 14/763,825

(22) PCT Filed: Jan. 30, 2014

(86) PCT No.: PCT/IB2014/058680
§ 371 (c)(1),
(2) Date: Jul. 28, 2015

(87) PCT Pub. No.: WO2014/125393
PCT Pub. Date: Aug. 21, 2014

(65) Prior Publication Data
US 2015/0365295 A1    Dec. 17, 2015

Related U.S. Application Data

(60) Provisional application No. 61/765,827, filed on Feb. 18, 2013.

(51) Int. Cl.
*G01R 31/04*    (2006.01)
*H04L 12/24*    (2006.01)
(Continued)

(52) U.S. Cl.
CPC .............. *H04L 41/12* (2013.01); *G01R 27/28* (2013.01); *G01R 31/043* (2013.01); *H04L 43/0811* (2013.01); *H04Q 1/136* (2013.01)

(58) Field of Classification Search
USPC .................................... 324/518, 539, 542, 66
See application file for complete search history.

(56) References Cited

U.S. PATENT DOCUMENTS 3,891,811 A * 6/1975 Miller .................. G01R 31/023
324/66
3,986,106 A    10/1976 Shuck et al.
(Continued)

FOREIGN PATENT DOCUMENTS

EP    1796403 A2    6/2007
RU    2310210 A1    11/2007

OTHER PUBLICATIONS

International Application PCT/IL2012/050140 Search report dated Oct. 9, 2012.
(Continued)

*Primary Examiner* — Vincent Q Nguyen
(74) *Attorney, Agent, or Firm* — D. Kligler IP Services Ltd.

(57) ABSTRACT

A method in a communication system (20) including endpoints (24) that connect to one another using cable channels, includes injecting one or more test signals to a cable channel, which has first and second ends and is potentially connected to a first endpoint at the first end and to a second endpoint at the second end. One or more serial measurements are performed on the cable channel so as to sense the test signals. Based on the serial measurements, a decision is made as to which of the first and second endpoints are indeed connected to the cable channel.

28 Claims, 8 Drawing Sheets

(51) Int. Cl.
*H04L 12/26* (2006.01)
*H04Q 1/02* (2006.01)
*G01R 27/28* (2006.01)

(56) References Cited

U.S. PATENT DOCUMENTS

| | | | |
|---|---|---|---|
| 4,074,187 A * | 2/1978 | Miller | G01R 31/021 |
| | | | 324/542 |
| 4,953,194 A | 8/1990 | Hansen et al. | |
| 5,107,532 A | 4/1992 | Hansen et al. | |
| 5,483,467 A | 1/1996 | Krupka et al. | |
| 5,523,747 A | 6/1996 | Wise | |
| 5,559,427 A * | 9/1996 | Hinds | H04L 43/50 |
| | | | 324/519 |
| 5,677,633 A | 10/1997 | Moser et al. | |
| 5,731,755 A | 3/1998 | Boxer | |
| 5,864,602 A | 1/1999 | Needle | |
| 5,978,449 A | 11/1999 | Needle | |
| 6,079,259 A | 6/2000 | Starman | |
| 6,198,292 B1 | 3/2001 | Kirk et al. | |
| 6,218,930 B1 | 4/2001 | Katzenberg et al. | |
| 6,259,258 B1 | 7/2001 | Cook et al. | |
| 6,356,532 B1 | 3/2002 | Richardson et al. | |
| 6,590,374 B1 | 7/2003 | Har Lev | |
| 6,961,675 B2 | 11/2005 | David | |
| 7,002,353 B1 | 2/2006 | Lo et al. | |
| 7,057,899 B2 | 6/2006 | Abughazaleh et al. | |
| 7,081,764 B1 | 7/2006 | Pandya et al. | |
| 7,235,979 B2 * | 6/2007 | Vitanza | H04M 3/30 |
| | | | 324/539 |
| 7,271,575 B2 | 9/2007 | Pickerd et al. | |
| 7,409,294 B2 | 8/2008 | Mead et al. | |
| 7,672,782 B2 | 3/2010 | Mead et al. | |
| 8,970,237 B2 | 3/2015 | Martin et al. | |
| 2002/0062189 A1 | 5/2002 | Kannonji | |
| 2002/0076950 A1 | 6/2002 | Frostorm et al. | |
| 2002/0105344 A1 | 8/2002 | Bohley | |
| 2002/0151201 A1 | 10/2002 | Bohbot | |
| 2003/0026009 A1 | 2/2003 | Vandenbrink | |
| 2003/0159609 A1 | 8/2003 | Rauscher | |
| 2004/0021452 A1 | 2/2004 | Hwang et al. | |
| 2004/0101133 A1 | 5/2004 | Le et al. | |
| 2004/0220736 A1 | 11/2004 | Wallace et al. | |
| 2005/0090982 A1 | 4/2005 | Mead et al. | |
| 2005/0111063 A1 | 5/2005 | Shar et al. | |
| 2005/0156757 A1 | 7/2005 | Garner | |
| 2005/0179533 A1 | 8/2005 | Stevenson | |
| 2005/0187701 A1 | 8/2005 | Baney | |
| 2005/0242825 A1 | 11/2005 | Bottman et al. | |
| 2005/0258818 A1 | 11/2005 | West | |
| 2005/0259033 A1 | 11/2005 | Levine | |
| 2005/0264299 A1 | 12/2005 | Manani et al. | |
| 2006/0063406 A1 | 5/2006 | Shifris et al. | |
| 2006/0094291 A1 | 5/2006 | Caveney et al. | |
| 2006/0128212 A1 | 6/2006 | Carrick | |
| 2006/0181433 A1 | 8/2006 | Wolterman | |
| 2006/0181449 A1 | 8/2006 | Aker | |
| 2006/0256540 A1 | 11/2006 | Abughazaleh et al. | |
| 2007/0030014 A1 | 2/2007 | Pandya et al. | |
| 2007/0132503 A1 | 6/2007 | Nordin | |
| 2007/0132573 A1 | 6/2007 | Quach et al. | |
| 2007/0206749 A1 | 9/2007 | Pincu et al. | |
| 2007/0241757 A1 | 10/2007 | Ku et al. | |
| 2007/0276600 A1 | 11/2007 | King et al. | |
| 2008/0045075 A1 | 2/2008 | Caveney et al. | |
| 2008/0061762 A1 * | 3/2008 | Blanchard | G01R 31/023 |
| | | | 324/66 |
| 2008/0082594 A1 | 4/2008 | Soltes et al. | |
| 2008/0141056 A1 | 6/2008 | Abughazaleh et al. | |
| 2008/0168283 A1 | 7/2008 | Penning | |
| 2008/0174453 A1 | 7/2008 | Schofield | |
| 2008/0253556 A1 | 10/2008 | Cobb et al. | |
| 2008/0320541 A1 | 12/2008 | Zinevich | |
| 2009/0055666 A1 | 2/2009 | Yee | |
| 2009/0177769 A1 | 7/2009 | Roberts | |
| 2010/0008482 A1 | 1/2010 | Tucker | |
| 2010/0033174 A1 | 2/2010 | Gleich et al. | |
| 2010/0117864 A1 | 5/2010 | Makukhin | |
| 2010/0159742 A1 | 6/2010 | Chen | |
| 2010/0176962 A1 | 7/2010 | Yossef | |
| 2010/0214126 A1 | 8/2010 | Publicover | |
| 2011/0112720 A1 | 5/2011 | Keep et al. | |
| 2011/0128136 A1 | 6/2011 | Katoh et al. | |
| 2011/0258839 A1 | 10/2011 | Probst | |
| 2011/0298603 A1 | 12/2011 | King et al. | |
| 2014/0043043 A1 | 2/2014 | Yossef | |
| 2014/0184238 A1 | 7/2014 | Yossef | |

OTHER PUBLICATIONS

U.S. Appl. No. 12/687,162 Office Action dated Feb. 14, 2013.
International Application PCT/IB2014/058680 Search Report dated May 20, 2014.
U.S. Appl. No. 14/173,889 Office Action dated May 6, 2016.

* cited by examiner

ENDPOINT MAPPING IN A COMMUNICATION SYSTEM USING SERIAL SIGNAL SENSING

FIELD OF THE INVENTION

The present invention relates generally to communication systems, and particularly to methods and systems for endpoint detection and mapping in communication systems.

BACKGROUND OF THE INVENTION

Various methods and systems are known in the art for identifying the connectivity scheme of a cable-based communication system, e.g., to detect whether endpoints are connected or disconnected. For example, U.S. Patent Application Publication 2010/0176962, whose disclosure is incorporated herein by reference, describes a system for monitoring devices that are physically connected over a data network. The system includes at least one scanner configured to monitor the data network and to determine devices that are physically connected over the data network. The scanner is connected to at least one panel over the data network, wherein at least one terminal of each panel is connected to electronic circuitry that comprises one or more electronic components for enabling the scanner to determine changes in one of voltage or current level over at least one of the electronic components, the changes occurring due to connecting or disconnecting devices over the data network.

As another example, PCT International Publication WO 2012/143926, whose disclosure is incorporated herein by reference, describes a method of analyzing patching among a first port of a first panel and ports of one or more other panels. The method includes obtaining with respect to the first port of the first panel an indication of multiple concurrent patchings between the first port and each of two or more different ports of other panels, the two or more different ports including at least a second port and a third port; injecting a scan signal between the first port and the second port and sensing for a corresponding returned signal between the second and the third ports; determining that an indication of a patching between the first port and the second port is false when a returned signal corresponding to the scan signal is detected between the second and the third ports.

SUMMARY OF THE INVENTION

An embodiment of the present invention that is described herein provides a method in a communication system including endpoints that connect to one another using cable channels. The method includes injecting one or more test signals to a cable channel, which has first and second ends and is potentially connected to a first endpoint at the first end and to a second endpoint at the second end. One or more serial measurements are performed on the cable channel so as to sense the test signals. Based on the serial measurements, a decision is made as to which of the first and second endpoints are indeed connected to the cable channel.

In some embodiments, each of the first and second endpoints includes a computer or a network switch. In some embodiments, injecting the test signals includes applying to the cable an Alternating Current (AC) test signal. In an embodiment, performing the serial measurements includes sensing the AC test signal over a resonant circuit, which is inserted in series with the cable and which has a resonance frequency that matches a frequency of the AC test signal. The method may include automatically estimating the resonance frequency of the resonant circuit, and setting the frequency of the AC test signal to match the estimated resonance frequency.

In a disclosed embodiment, performing the serial measurements includes performing a first serial measurement at a first port that potentially leads to the first endpoint and performing a second serial measurement at a second port that potentially leads to the second endpoint. In an example embodiment, injecting the test signals includes applying a first AC test signal to the first port and applying a second AC test signal to the second port. In an alternative embodiment, injecting the test signals includes applying a single AC test signal to the first port, for use in performing both the first and second serial measurements.

In some embodiments, injecting the test signals includes applying to the cable a Direct Current (DC) test signal. In an embodiment, performing the serial measurements includes sensing the DC test signal over a resistance that is inserted in series with the cable. In a disclosed embodiment, injecting the test signals includes applying a first DC test signal to a first port that potentially leads to the first endpoint, applying a second DC test signal to a second port that potentially leads to the second endpoint, and, when the first and second ports are patched to one another, equalizing respective voltages of the first and second DC test signals.

In some embodiments, deciding which of the endpoints are connected includes comparing respective amplitudes of the sensed test signals to a threshold. Deciding which of the endpoints are connected may include distinguishing among a first scenario in which the first endpoint is connected to the first end but the second endpoint is not connected to the second end, a second scenario in which the second endpoint is connected to the second end but the first endpoint is not connected to the first end, and a third scenario in which the first and second endpoints are connected to the first and second ends, respectively.

There is additionally provided, in accordance with an embodiment of the present invention, apparatus including an interface and test circuitry. The interface is coupled to connect to a communication system including endpoints that connect to one another using cable channels. The test circuitry is configured to inject via the interface one or more test signals to a cable channel, which has first and second ends and is potentially connected to a first endpoint at the first end and to a second endpoint at the second end, to perform one or more serial measurements on the cable channel so as to sense the test signals, and, based on the serial measurements, to decide which of the first and second endpoints are indeed connected to the cable channel.

There is also provided, in accordance with an embodiment of the present invention, a keystone jack including a receptacle, at least a pair of rear interconnection terminals, a sense interface and an injection interface. The receptacle includes at least a pair of receptacle terminals for connecting to a wire pair in a mating keystone plug. The pair of rear interconnection terminals are connected to the pair of the receptacle terminals. The sense interface is inserted in series between the pair of receptacle terminals and the pair of the pair of the rear interconnection terminals, for serially sensing at least one test signal on the wire pair. The injection interface is coupled to inject the at least one test signal to the wire pair on at least one respective side of the sense interface.

In some embodiments, the injection interface is coupled to inject first and second test signals on respective first and second opposite sides of the sense interface. In an embodiment, the sense interface includes a resonant circuit. In another embodiment, the sense interface includes a resistor.

The present invention will be more fully understood from the following detailed description of the embodiments thereof, taken together with the drawings in which:

DETAILED DESCRIPTION OF EMBODIMENTS

Overview

Figure 1:
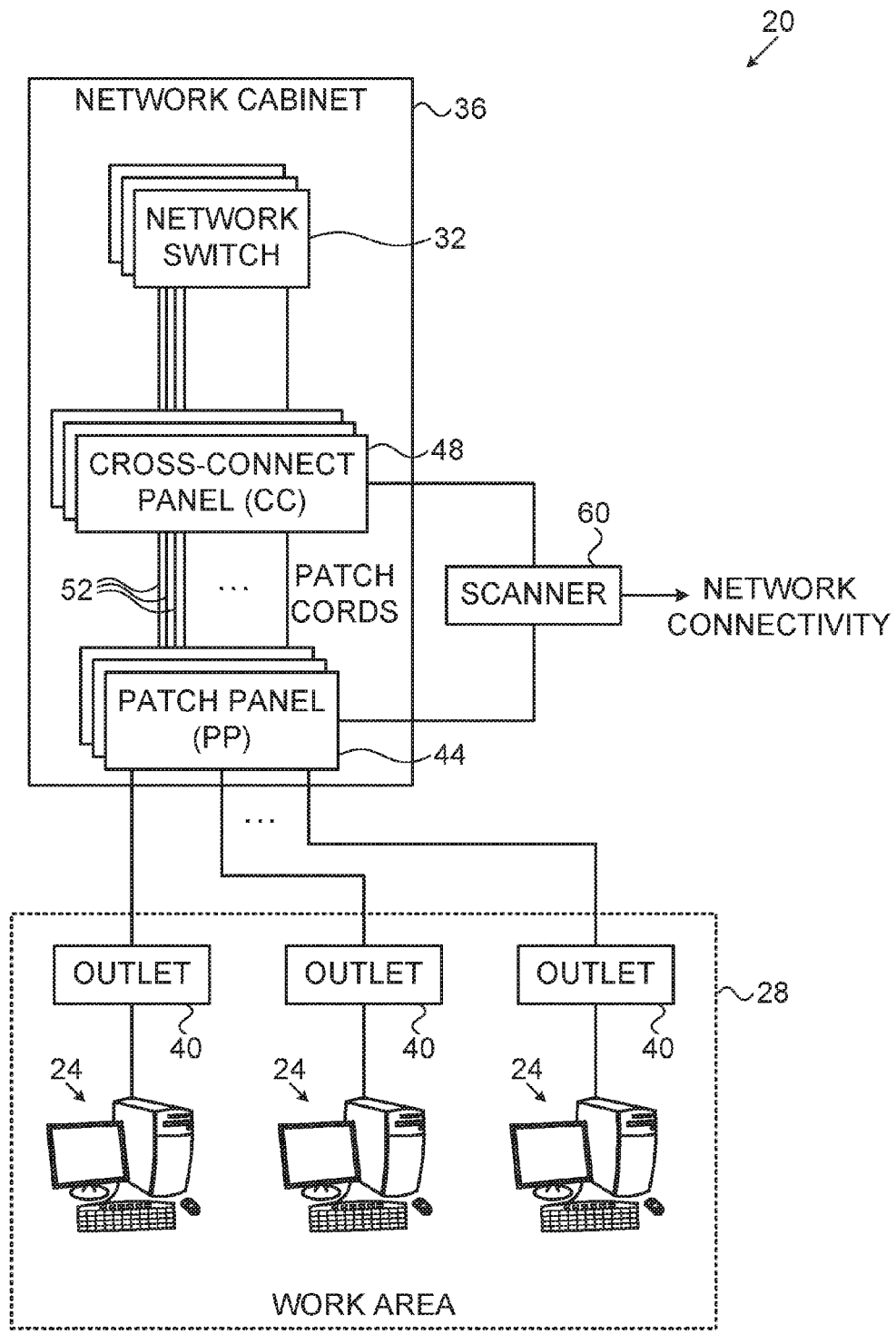
FIG. 1 is a block diagram that schematically illustrates a communication system that uses automatic endpoint detection and mapping, in accordance with an embodiment of the present invention.

Various types of communication systems comprise endpoints that connect to the system using cables. A typical Local Area Network (LAN), for example, comprises multiple user computers and one or more network switches, all of which are referred to herein as endpoints.

In order to manage the system efficiently and identify failures, it is important to maintain accurate and up-to-date information as to the system connectivity, e.g., which of the endpoints are indeed connected to the system via their respective cables, and which user computer is connected to which switch port.

Embodiments of the present invention that are described herein provide improved methods and systems for automatic detection and mapping of endpoints in cable-based communication systems. In the disclosed embodiments, a scanner tests the cables leading to the various endpoints of the system, and automatically determines which of the cables indeed has an endpoint connected to its far end. The resulting system connectivity view is provided as output to a user, such as a system administrator. The disclosed techniques test the physical connectivity of endpoints, e.g., corresponding to OSI layer-1, regardless of whether the endpoints are turned on or off.

In some embodiments, the scanner tests a given cable by applying an Alternating Current (AC) test signal and sensing the test signal serially. In the context of the present patent application and in the claims, the terms "serial measurement" or "serial sensing" refer to measurement or sensing of the voltage that falls across a component that is inserted in series with the potential endpoint.

In an example embodiment, the scanner senses the AC test signal over a resonant L-C circuit, which is inserted in series with the cable and has a resonant frequency that matches the frequency of the test signal. The resonant circuit senses the cable with selective amplification around the frequency of the test signal, and therefore this sensing scheme is highly sensitive. In an alternative embodiment, the scanner senses a Direct Current (DC) test signal over a resistance that is inserted in series with the cable.

By performing serial sensing rather than parallel sensing over the cable, the scanner is able to distinguish reliably between connectivity at the two ends of a cable. In other words, the scanner is able to decide whether a cable has no endpoints connected, a single connected endpoint and at which end, or two connected endpoints. As such, the methods and systems described herein provide an accurate view of the system connectivity, and therefore enable efficient system management and fault detection.

Moreover, the disclosed techniques do not cause interference to the communication activity over the cables, and coexist well with electrical power transfer systems such as Power over Ethernet (PoE). Test signal injection and sensing are performed regardless of whether the endpoints are turned on or off, and regardless of whether communication is active or not.

Several example configurations of scanners and sensing circuits are described herein. Example system-level endpoint mapping processes that use the disclosed techniques are also described.

System Description

FIG. 1 is a block diagram that schematically illustrates a communication system 20 that uses automatic endpoint detection and mapping, in accordance with an embodiment of the present invention. In the present example, system 20 comprises an Ethernet™-based LAN that connects multiple user computers 24 in a certain work area 28 with one or more network switches 32. User computers 24 are also referred to herein as user devices or simply devices. Switches 32 and devices 24 are collectively referred to herein as endpoints.

Switches 32 are installed in a communication cabinet 36, which also comprises a Cross-Connect panel (CC) 48 and a Patch Panel (PP) 44. Each of these panels typically comprises an array of keystone jacks. The ports of switches 32 are connected to CC 48, and the cables leading to devices 24 in work area 28 are connected to PP 44. Interconnection between switches 32 and devices 24 is configured manually by connecting patch cords 52 between the CC and the PP. Each patch cord 52 plugs into one of the keystone jacks of CC 48 and one of the keystone jacks of PP 44, thereby connecting one of the switch ports to a cable leading to one of the devices. Each device 24 connects to its respective cable via an outlet 40, typically a wall-mounted socket.

The end-to-end path between a given device 24 and a given port of switch 32 (over an outlet 40, PP 44, patch cord 52, CC 48 and the connecting cables) is referred to herein as a channel. A real-life LAN may comprise hundreds of channels or more, although any other suitable numbers can be used. Managing and troubleshooting such a system of this size is challenging, and requires quality management tools.

The scheme of system 20 in FIG. 1 is referred to as a cross-connect configuration. In other embodiments, switches 32 and devices 24 may be connected using an alternative configuration that is referred to as an interconnect configuration. A typical interconnect configuration has only PP 44 and no CC 48. The front of each switch port is connected to the front of a respective keystone jack in PP 44 using a respective patch cord 52. The rear of each keystone jack in PP 44 is connected to the rear of a respective work-area outlet 40, and the front of each work-area outlet 40 is connected to a respective device 24. Although the embodiments described herein refer mainly to the cross-connect configuration of FIG. 1, the disclosed techniques can be used with various other system configurations, such as interconnect configurations.

In some embodiments, system 20 comprises a scanner 60, which automatically detects and maps the connectivity of system 20 using techniques that are described in detail below. Scanner 60, assisted by circuitry that is fitted in PP 44 and CC 48, tests the cables leading to the various endpoints (switches and devices) and detects whether an endpoint is indeed connected to each cable. The scanner is able to perform reliable endpoint detection both for patched channels (full end-to-end channels connected by a patch cord) and for non-patched cables leading to a switch port or device. In addition, the scanner typically supports a panel-to-panel scan process that maps which CC ports are patched to which PP ports.

The output of scanner 60 typically comprises a map or list that indicates which cables leading from the PP are indeed connected to devices in the work area, which cables leading from the CC are indeed connected to switch ports, and which PP jacks are patched to which CC jacks. This connectivity map or list is provided as output. The connectivity map can be used, for example, to detect events such as a device 24 that is unplugged from its outlet 40, a faulty cable leading to a switch port or device, a faulty or disconnected patch cord 52, or any other suitable event.

Further details regarding the functionality and system-level operation of scanner 60 can be found in U.S. Patent Application Publication 2010/0176962 and PCT International Publication WO 2012/143926, cited above.

The description that follows initially describes techniques for detecting endpoints at the individual channel level. System-level processes that use these techniques are described further below.

Endpoint Detection Using Serial Sensing of AC Signal

Figure 2:
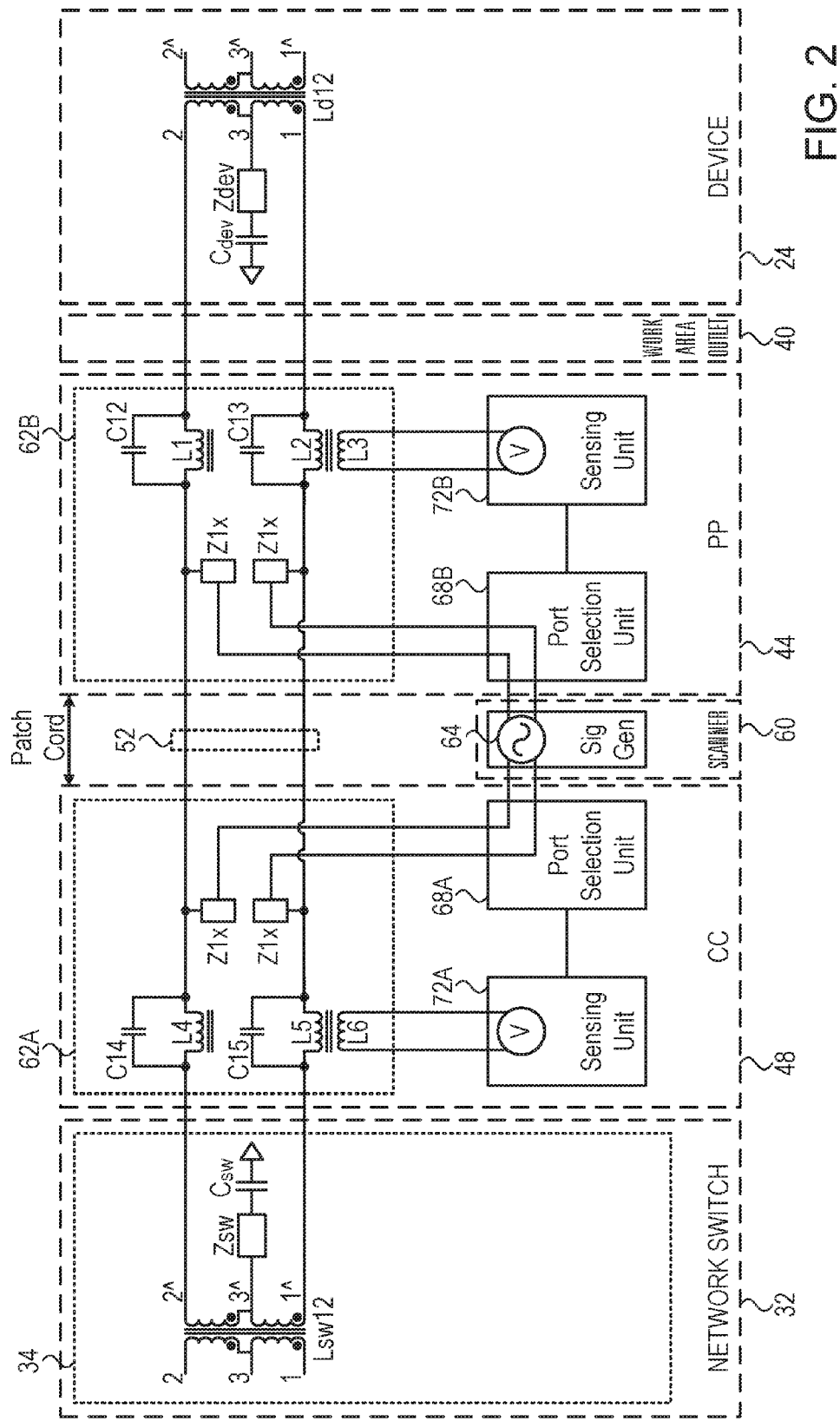
FIGS. 2 and 3 are circuit diagrams that schematically illustrate schemes for endpoint detection, in accordance with embodiments of the present invention.

FIG. 2 is a circuit diagram that schematically illustrates a scheme for endpoint detection, in accordance with an embodiment of the present invention. FIG. 2 shows a single cross-connect channel, and this configuration is typically duplicated in the other channels of system 20.

In an Ethernet-based network, a given channel typically comprises four differential pairs of wires (usually twisted pairs), i.e., a total of eight wires. Scanner 60 tests a selected pair out of the four. This pair is shown in the figure connecting a device 24 to a port 34 of a switch 32. The channel traverses a keystone jack 62A in CC 48, a patch cord 52 and a keystone jack 62B in PP 44.

On the switch side, the pair is terminated by a transformer Lsw12, whose center tap is grounded via a resistor Zsw and a capacitor Csw. On the device side, the pair is terminated by a transformer Ld12, whose center tap is grounded via a resistor Zdev and a capacitor Cdev.

Scanner 60 tests each side of the channel (i.e., the side leading from PP 44 to device 24 and the side leading from CC 48 to switch 32) individually, regardless of whether patch cord 52 is connected between them or not. Testing is performed by applying an AC test signal to the tested side, and sensing the test signal serially on the cable.

Scanner 60 comprises a signal generator 60 that generates the AC test signal. In an example embodiment, the signal comprises a differential sinusoidal signal having a frequency on the order of 1 KHz, although any other frequencies can be used. The test signal is provided to PP 44 and to CC 48 for testing the device side and the switch side of the channel, respectively. (In FIG. 2 the scanner is shown as a separate unit. In alternative embodiments, the scanner may be integrated into one of the elements of system 20, e.g., into PP 44 or CC 48.)

CC 48 comprises a port selection unit 68A that selects the keystone jack 62A (and thus the channel) to be tested. (CC 48 comprises multiple jacks 62A, and a single unit 68A that may alternate among them.) In keystone jack 62A, the test signal is injected differentially to the wire pair via impedance elements Z1$x$. Elements Z1$x$ may comprise, for example, resistors, capacitors, inductors, or any suitable combination thereof.

Keystone jack 62A further comprises an L-C resonant circuit that is inserted serially in the pair of wires. The resonant circuit comprises a transformer (with primary windings L4 and L5, and secondary winding L6) and capacitors C14 and C15. The resonant circuit is used for sensing the AC test signal.

If the switch side of the channel is indeed terminated by switch port 34, then the test signal will appear on the secondary winding L6 with large amplitude. If the switch side of the channel is not terminated, then the test signal will not be detected at L6, or detected with very small amplitude. The terminals of L6 are provided as output of the keystone jack. (A keystone jack of this sort is described in greater detail with reference to FIG. 4 below.)

The voltage on L6 is sensed by a sensing unit 72A in CC 48. (CC 48 typically comprises a single unit 72A that senses the L6 outputs of the various keystone jacks of the CC.) The output of sensing unit 72A is provided to scanner 60. In an example embodiment, unit 72A indicates to the scanner whether the sensed test signal amplitude on L6 is above or below some threshold, i.e., whether the channel is indeed terminated by port 34 or not.

The device side of the channel is tested in a similar manner: PP 44 comprises a port selection unit 68B that selects the keystone jack 62B (and thus the channel) to be tested. (PP 44 comprises multiple jacks 62B, and a single unit 68B that may alternate among them.) In keystone jack 62B, the test signal is injected differentially to the wire pair via impedance elements Z1$x$. Keystone jack 62B comprises an L-C resonant circuit that is inserted serially in the pair of wires. The resonant circuit comprises a transformer (with primary windings L1 and L2, and secondary winding L3) and capacitors C12 and C13.

If the device side of the channel is indeed terminated by device 24, then the test signal will appear on the secondary winding L3 with large amplitude. If the device side of the channel is not terminated, the test signal will not be detected at L3, or detected with very small amplitude. The terminals of L3 are provided as output of the keystone jack. The test signal amplitude on L3 is sensed by a sensing unit 72B in PP 44. (PP 44 typically comprises a single unit 72B that senses the L3 outputs of the various keystone jacks of the PP.) The output of sensing unit 72B is provided to scanner 60. In an example embodiment, unit 72B indicates to the scanner whether the sensed test signal amplitude on L3 is above or below some threshold, i.e., whether the channel is indeed terminated by device 24 or not.

Because of the serial sensing, scanner 60 is able to test each side of the channel independently of the other side, even if patch cord 52 is connected between jacks 62A and 62B. The amplitude of the test signal on L6 is indicative of whether the switch side of the channel is terminated by port 34, regardless of whether device 24 is connected or not. Similarly, the amplitude of the test signal on L3 is indicative of whether the device side of the channel is terminated by device 24, regardless of whether switch port 34 is connected or not. This sort of independence is a valuable mapping tool, which is not possible with parallel sensing techniques.

In some embodiments, the resonance frequencies of the L-C resonant circuits (L1&C12, L2&C13, L4&C14 and L5&C15) are chosen so as to match the frequency of the AC test signal. With this choice of resonance frequency, the signal induction to L3 and L6 exhibits selective amplification around the frequency of the test signal. Therefore, the test signal at L3 and L6 has a high signal-to-noise ratio, meaning that the sensing operation is highly sensitive. This technique enables scanner 60 to use low-power test signals, and still achieve reliable sensing. In one example embodiment, each Z1x element comprises a 10 KΩ, resistor, and the test signal has a voltage of 12 VAC.

Typically, the Ohmic resistances of the L-C resonant circuits (i.e., the resistances of L1, L2, L4 and L5) are small, on the order of fractions of an Ohm, so as not to degrade communication performance and to enable possible Power over Ethernet (PoE) operation. The voltage or power falling on the resonant circuits is therefore small, which could potentially degrade the sensing sensitivity of the test signal. Matching the resonance frequency of the circuits to the frequency of the test signal overcomes this problem, and enables using small line resistance while still sensing the test signal with high sensitivity.

In the example of FIG. 2, the test signal for testing the switch side of the channel is injected via unit 68A to keystone jack 62A in the CC, and the test signal for testing the device side of the channel is injected via unit 68B to keystone jack 62B in the PP. In an alternative embodiment, scanner 60 may inject the test signal to only one of the sides (keystone jack 62A or 62B but not both), and sense the switch side (L6) and the device side (L3) simultaneously in response to the same test signal. Since the sensing is serial, each sense operation is independent of the other.

In the example of FIG. 2, injection and sensing are performed in one of the wire pairs selected from the four pairs of the channel. Generally, test signal injection and sensing may be performed on any desired wire pair.

Figure 3:
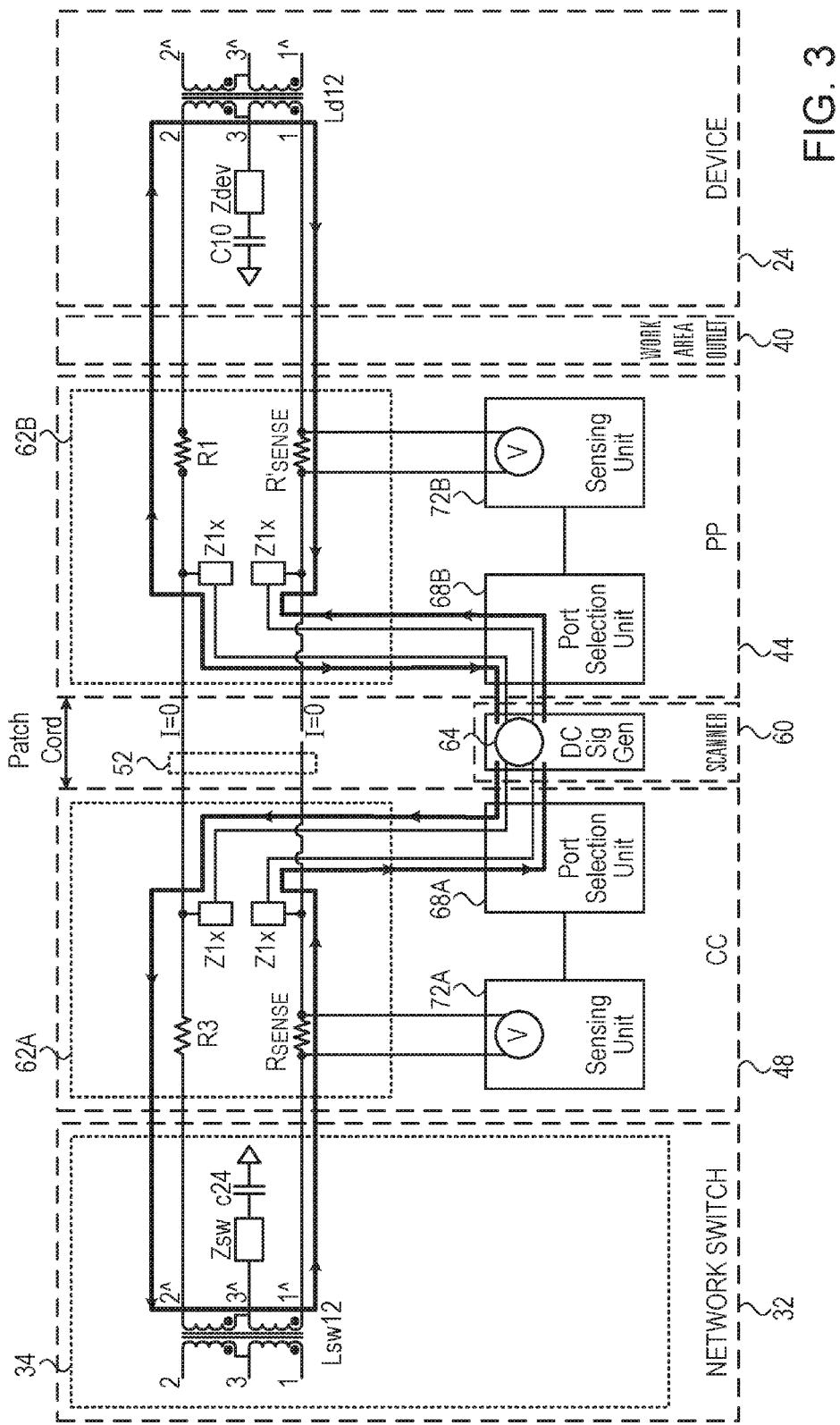

FIG. 3 is a circuit diagram that schematically illustrates a scheme for endpoint detection, in accordance with an alternative embodiment of the present invention. The scheme of FIG. 3 is similar to that of FIG. 2 above, with the exception of the serial sensing arrangement on the pair of wires, and the use of a Direct Current (DC) test signal instead of an AC test signal.

In the scheme of FIG. 3, scanner 60 generates and injects a DC test signal. The test signal is sensed over resistors $R_{SENSE}$ and $R'_{SENSE}$ that are inserted in series with the cable on the switch and device sides of the channel, respectively. The resistances of $R_{SENSE}$ and $R'_{SENSE}$ are small, on the order of fractions of an Ohm. Resistors R3 and R1 having similar resistances are inserted in the opposite wire, so as to balance the differential voltage over the pair.

When the pair is properly balanced, the test signal causes no current to flow over patch cord 52 (indicated as I=0 in the figure). The electrical current caused by the test signal flows independently on each side of the channel, as marked with bold arrows in the figure. As a result, scanner 60 is able to detect whether an endpoint is connected to each side of the channel independently of the other side. In each of the two wires of the channel pair, scanner 60 may achieve this balance by equalizing the voltages on the two sides of patch cord 52. Balancing the voltages is needed for ensuring that sensing the test signal on one side of the channel will not affect the other side.

Figure 4:
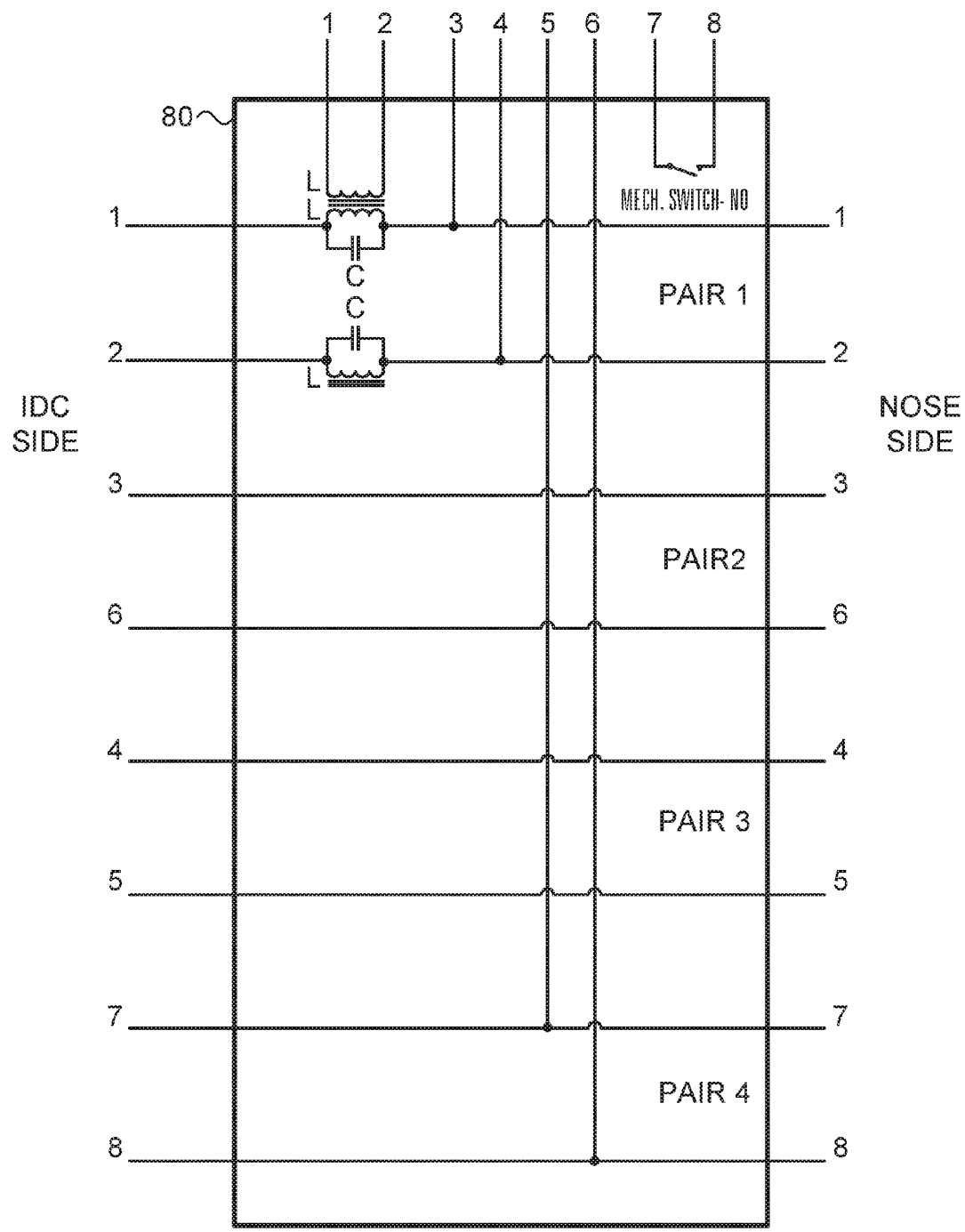
FIG. 4 is a circuit diagram of a keystone jack, in accordance with an embodiment of the present invention.

FIG. 4 is a circuit diagram of a keystone jack 80, in accordance with an embodiment of the present invention. This keystone jack can be used, for example, to implement jacks 62A in CC 48 and/or jacks 62B in PP 44. Keystone jack 80 comprises a total of eight lines denoted 1 . . . 8, arranged in four pairs denoted PAIR1 . . . PAIR4.

The right-hand-side of the figure (marked "nose side") shows the lines that connect to the front panel socket on CC 48 or PP 44, i.e., the lines that connect to patch cord 52. The left-hand-side of the figure (marked "IDC side") shows the lines that connect the CC to the switches, or the PP to the devices.

The top of the figure shows eight test lines used for test signal injection and sensing and other testing purposes. Test lines 1 and 2 provide the sensed voltage on PAIR1. These lines correspond to the sensing of L6 in keystone jack 62A or the sensing of L3 in keystone jack 62B, both in FIG. 2.

Test lines 3 and 4 are used for test signal injection to PAIR1 by port selection unit 68A or 68B. (Impedance elements Z1x are not shown in this figure, since in this example they are part of the electronic circuit and not of keystone jack 80. In alternative embodiment the impedance elements may be part of the keystone jack.) Test lines 5 and 6 are used for other sensing techniques, e.g., pair-to-pair common-mode termination or patch cord detection.

In some embodiments, keystone jack 80 comprises a mechanical switch that is connected between test lines 7 and 8. This switch detects physical plugging of a patch cord into the keystone jack. In the present example the switch is normally-open, i.e., closed when a patch cord is plugged-in and open otherwise. Alternatively, the switch may be normally-closed using the opposite logic. The switch condition can be read by scanner 60, e.g., directly or via the port selection or sensing unit. The use of this switch is addressed in the description of the system-level processes further below.

The configuration of keystone jack 80 corresponds to the endpoint detection scheme of FIG. 2, in which the test signal is sensed using an L-C resonant circuit. An alternative configuration of the keystone jack, corresponding to the scheme of FIG. 3, comprises resistors instead of the L-C resonant circuit.

In another alternative embodiment, the keystone jack comprises two additional test lines that are used for injecting the AC test signal on the IDC side of PAIR1 (in addition to test lines 3 and 4 that inject the test signal on the node side of PAIR1). Such a keystone jack enables scanner 60 to inject the test signal on either side of the sensing circuitry, and thus to test both sides of the channel using the same keystone jack. This configuration is useful, for example, in interconnect configurations that do not comprise a separate CC and PP but rather a single interconnect panel as described above.

The configurations shown in FIGS. 1-4 are example configurations that are chosen purely for the sake of conceptual clarity. In alternative embodiments, any other suitable configuration can be used for implementing the various system elements. For example, system 20 may operate in accordance with any other suitable network protocol, not necessarily Ethernet. The system may comprise any other suitable type of network, not necessarily a LAN.

The disclosed techniques can be implemented using any other suitable set of elements, which may be embedded or integrated with system 20 in any suitable way. Generally, the elements that connect to the communication system for test signal injection and sensing (e.g., the L-C resonant circuits or resistors $R_{SENSE}$ and $R'_{SENSE}$, and resistors Z1x) are referred to herein as an interface, and the elements that carry out the endpoint detection and mapping processes (e.g., scanner 60, port selection units 68A and 68B, and sensing units 72A and 72B) are referred to herein as test circuitry.

The various system elements may be implemented using hardware/firmware, such as in one or more Application-Specific Integrated Circuit (ASICs) or Field-Programmable Gate Array (FPGAs). Alternatively, some system elements, such as certain functions of scanner 60 and the port selection units, may be implemented in software or using a combination of hardware/firmware and software elements. Some system elements may be implemented using a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Endpoint Detection and Mapping Processes

Figure 5:
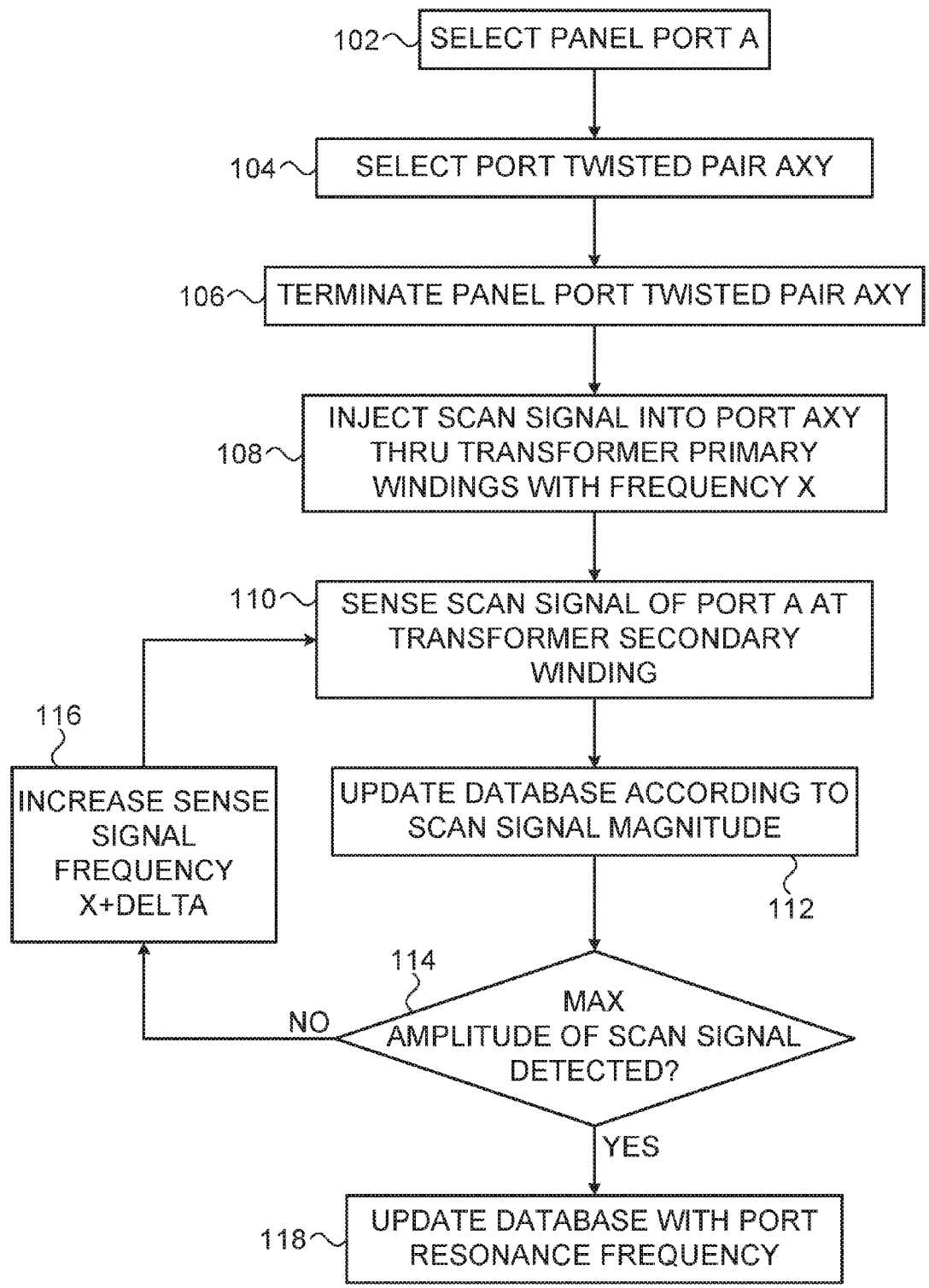
FIG. 5 is a flow chart that schematically illustrates a method for calibration of test signal frequency, in accordance with an embodiment of the present invention.

FIG. 5 is a flow chart that schematically illustrates a method for calibrating the frequency of the AC test signal used by scanner 60, in accordance with an embodiment of the present invention. In this embodiment, scanner 60 fine-tunes the frequency of the AC test signal per L-C resonant circuit, i.e., per each side of each channel, so as to match the actual resonance frequency of the resonant circuit. Each side of a channel (switch side or device side) is referred to as a port, since it corresponds to a port of CC 48 or PP 44.

The technique of FIG. 5 can be used, for example, when the resonance frequency varies from one resonant circuit to another in the system. The variations may be caused, for example, by component tolerance, temperature or any other factor. Individual calibration of this sort is especially important when the resonant circuits have high Q, i.e., resonate only within a narrow bandwidth around the actual resonance frequency.

The method of FIG. 5 begins with scanner 60 selecting a port to be calibrated, at a port selection step 102. The selected port is referred to as port A. Within this port, scanner 60 selects a twisted pair to be calibrated, at a pair selection step 104. (In the embodiments described above a test signal is injected only to a single pair of wires. Alternatively, however, the system may be implemented so as to enable testing of more than one pair per port.) The selected pair in port A is referred to as pair AXY.

A user terminates the corresponding CC or PP keystone jack with a short-circuit plug, at a termination step 106. The short-circuit plug creates a loopback connection on the panel, i.e., shorts the two lines of the pair to be calibrated.

Scanner 60 and the relevant port selection unit (68A or 68B) inject an AC test signal to the selected pair AXY, at an injection step 108. The test signal is injected via impedance elements Z1x of the selected port. The test signal is initialized to an initial frequency denoted X.

The relevant sensing unit (72A or 72B) senses the test signal over the resonant circuit of the selected port (i.e., at the secondary winding L6 or L3), at a sensing step 110. Scanner 60 updates its internal database with the magnitude of the sensed test signal, at an amplitude recording step 112.

Scanner 60 checks whether the maximum sensed amplitude of the test signal was found, at a maximum checking step 114. If not, the scanner increments frequency X by a certain step denoted DELTA, at a frequency incrementing step 116, and the method loops back to step 110 above.

The process continues until scanner 60 detects that the maximum sensed amplitude of the test signal (corresponding to the actual resonance frequency of the resonant circuit) has been found. At this stage, the scanner updates its database with the test signal frequency that resulted in the maximum sensed amplitude, at a resonance updating step. Subsequent testing of this port will be performed using a test signal at this frequency.

The process of FIG. 5 is typically repeated per port, so as to produce a database that gives the optimal frequency of the AC test signal per port. In an example embodiment, the nominal frequency of the test signal is 1 KHz, and the calibration is performed over 1 KHz±200 Hz. In alternative embodiments, however, any other suitable frequencies and calibration ranges can be used.

Figure 6:
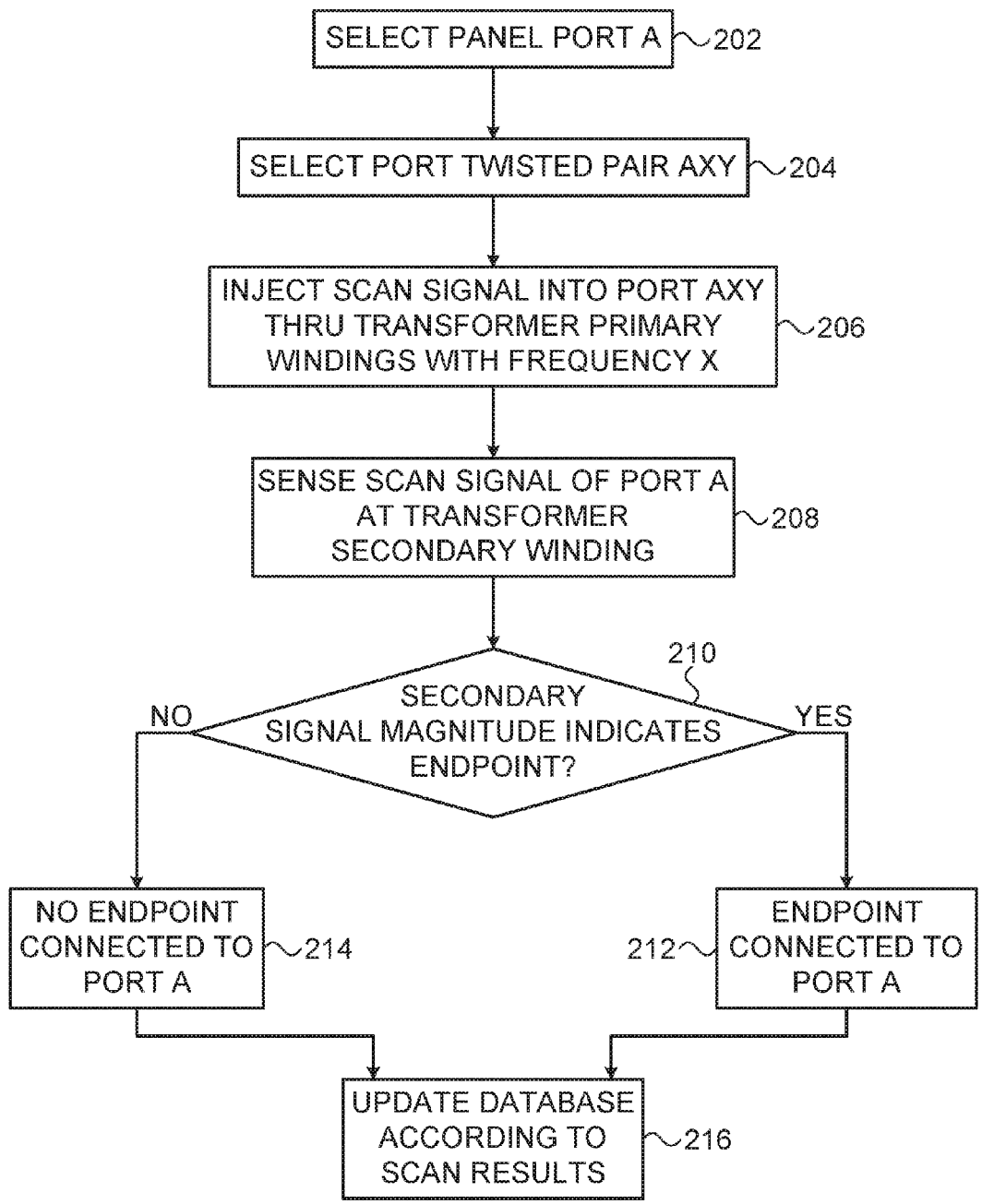
FIG. 6 is a flow chart that schematically illustrates a method for automatic endpoint detection, in accordance with an embodiment of the present invention.

FIG. 6 is a flow chart that schematically illustrates a method for automatic endpoint detection, in accordance with an embodiment of the present invention. This method corresponds to the configuration of FIG. 2 above, and is typically repeated per port.

The method begins with scanner 60 selecting the port to be tested, referred to as port A, at a port selection step 202. Within this port, scanner 60 selects a twisted pair to be tested, referred to as pair AXY, at a pair selection step 204. Scanner 60, using the relevant port selection unit, injects the AC test signal to the selected pair, at an injection step 206. The relevant sensing unit senses the test signal at the secondary winding of the transformer of the relevant L-C resonant circuit, at a sensing step 208.

Scanner 60 checks whether the amplitude of the sensed test signal indicates a connected endpoint, at an endpoint checking step 210. For example, the scanner may compare the sensed amplitude to a predefined threshold, such that amplitudes above the threshold indicate a connected endpoint and vice versa.

If the sensed amplitude of the test signal is low, the scanner concludes that an endpoint is not connected to the tested port, at a negative decision step 214. If the sensed amplitude is high, the scanner concludes that an endpoint is connected to the tested port, at a positive decision step 216. The scanner updates its internal database with the test results, at a database updating step 216.

Figure 7:
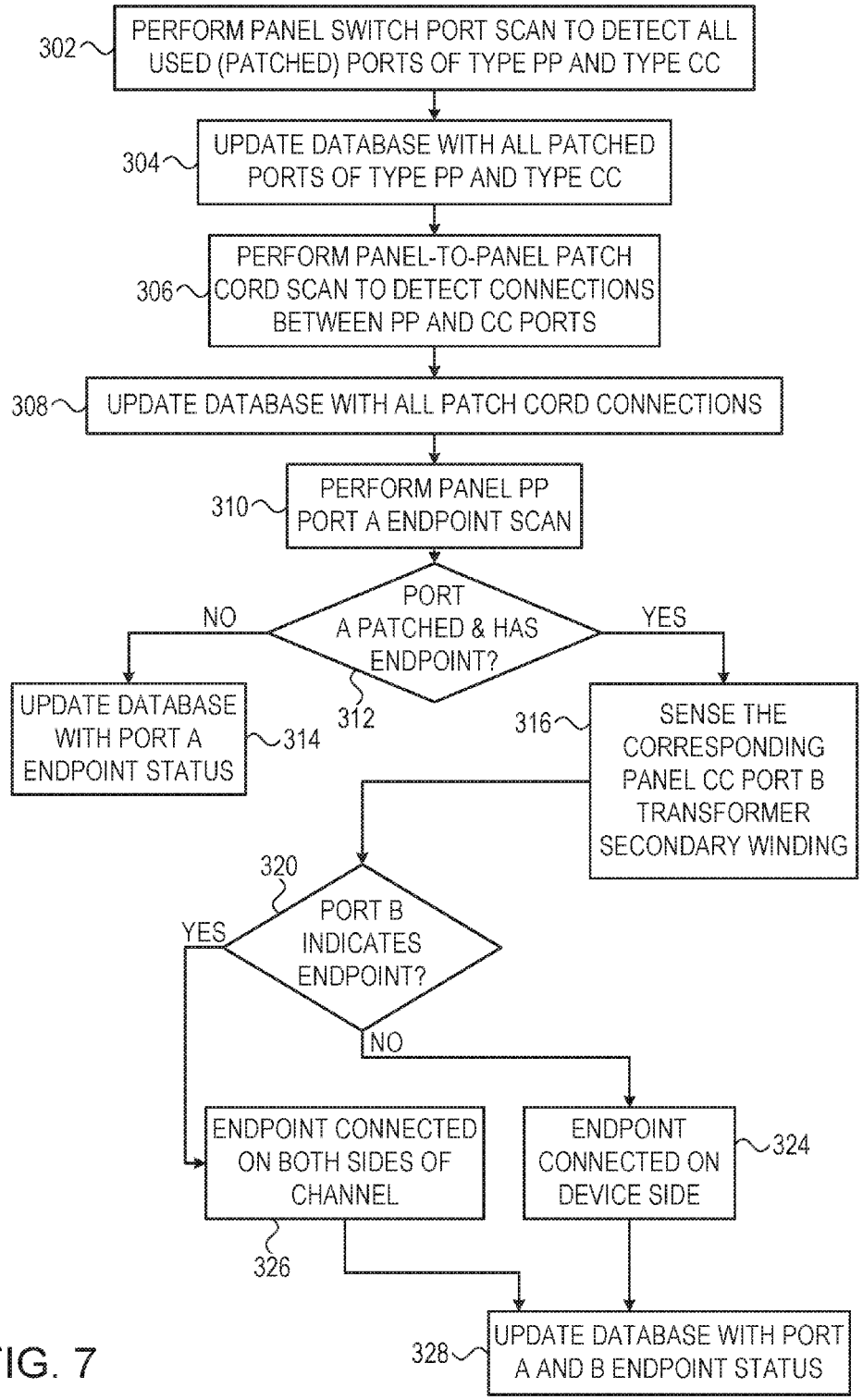
FIG. 7 is a flow chart that schematically illustrates a method for automatic endpoint detection and mapping, in accordance with an embodiment of the present invention.

FIG. 7 is a flow chart that schematically illustrates a method for automatic endpoint detection and mapping, in accordance with an embodiment of the present invention. This system-level process uses the endpoint detection method of FIG. 6 as a building block, and produces a full connectivity map of system 20. This example refers to cross-connect configurations. A similar process may be defined, mutatis mutandis, for interconnect configurations. Even for cross-connect configurations, the method of FIG. 7 is just one possible example. Any other suitable system-level process or flow, using the disclosed injection and sensing techniques, can be defined.

The method of FIG. 7 begins with scanner 60 scanning the ports of PP 44 and CC 48 and detecting the ports that are connected to patch cords 52, at a patch detection step 302. Scanner 60 typically performs this step by reading the mechanical switches fitted in the keystone jacks of the various CC and PP ports (see FIG. 4). The scanner updates its internal database with the status of each CC and PP port, i.e., records whether each port is patched or not, at a patch updating step 304.

Scanner 60 then performs a panel-to-panel patch scan, at a patch cord mapping step 306. The output of this step is a list of the pairs of {CC port, PP port} that are connected by a patch cord. Scanner 60 updates its database with this list, at a patch cord updating step 308.

Scanner 60 now selects a certain PP port denoted port A, at a PP port selection step 310. The scanner performs endpoint detection for this PP port, i.e., detects whether a device 24 is connected to this PP port or not, at a device detection step 310. The scanner typically uses the method of FIG. 6 for this purpose.

The scanner now checks whether PP port A is both patched and has a device connected to it, at a patch & endpoint checking step 312. If the PP port is not patched, i.e., not connected to any switch port, or if it has no device connected, the scanner updates its database with the result of the endpoint detection of this port, and the method terminates.

If, on the other hand, PP port A is patched to some CC port denoted port B, and has a device connected, scanner 60 performs endpoint detection for CC port B, at a switch detection step 316. As explained above, the scanner may sense CC port B while sensing PP port A (at step 310) using the same test signal injection.

Scanner 60 then checks whether the endpoint detection of CC port B indicates a connected endpoint, at a switch checking step 320. If so, the scanner concludes that endpoints are connected to both ends of the channel, at a dual endpoint decision step 326. If not, the scanner concludes that an endpoint is connected only on the device side of the channel, at a device decision step 324.

Following step 324 or 326, scanner 60 updates its database to reflect the connectivity status of the channel, at a channel database updating step 328. The process of steps 310-328 is typically repeated per channel, so as to obtain a complete connectivity map of system 20.

Figure 8:
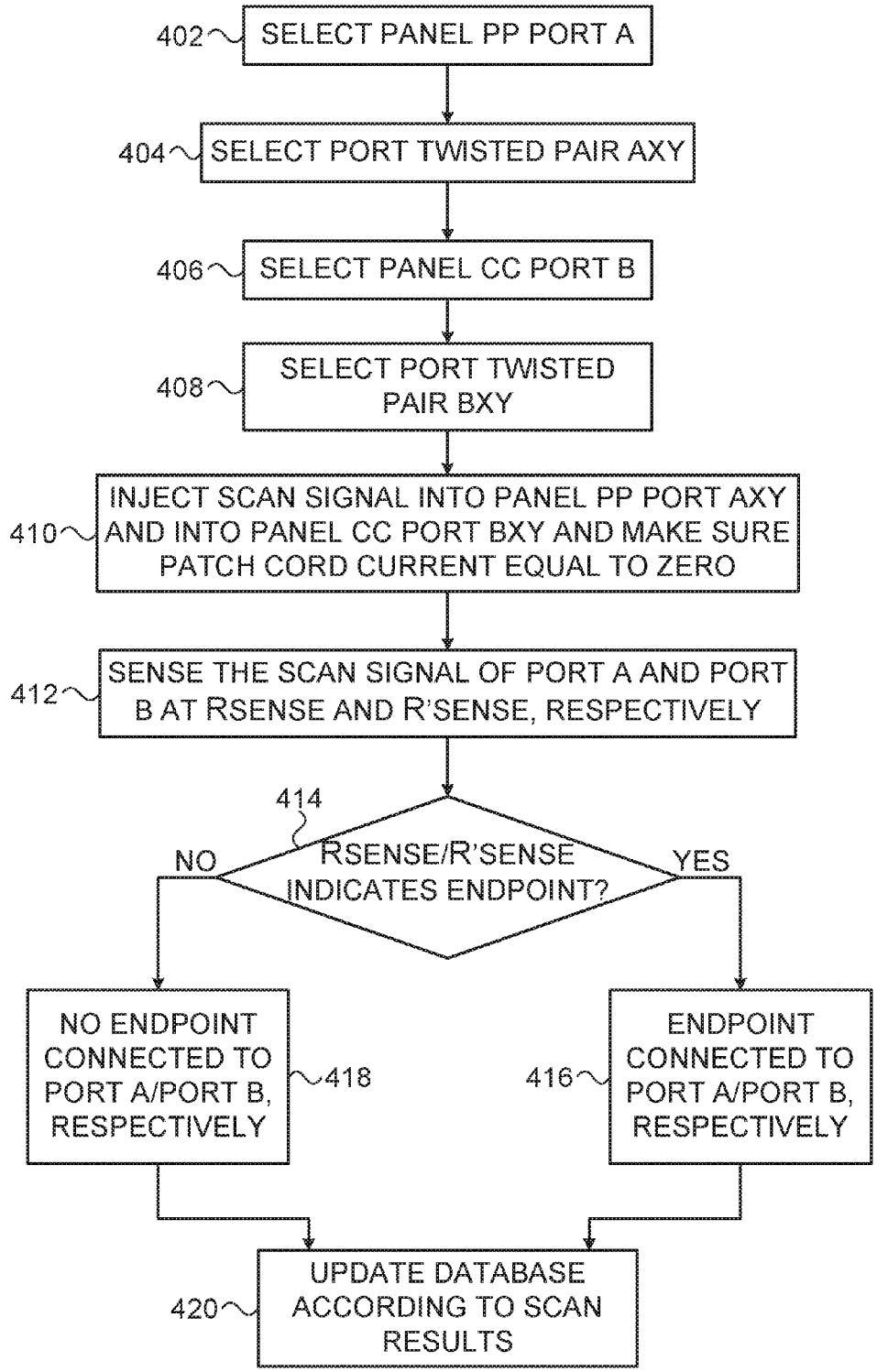
FIG. 8 is a flow chart that schematically illustrates a method for automatic endpoint detection, in accordance with another embodiment of the present invention.

FIG. 8 is a flow chart that schematically illustrates a method for automatic endpoint detection, in accordance with another embodiment of the present invention. This method corresponds to the endpoint detection scheme of FIG. 3 above. The process below is initiated for a PP port denoted A and a CC port B that are known to be patched to one another.

The method of FIG. 8 begins with scanner 60 selecting the PP port denoted A to be tested, at a PP port selection step 402. Within this port, scanner 60 selects a twisted pair to be tested, referred to as pair AXY, at a pair selection step 404. The scanner then selects the CC port B that is patched to PP port A, at a CC port selection step 406. Within this port, scanner 60 selects a twisted pair to be tested, referred to as pair BXY, at a pair selection step 408.

The scanner, using port selection units 68A and 68B, injects DC test signals to the selected pairs AXY and BXY, at an injection step 410. While injecting the test signals, scanner 60 ensures that the patch cord current is substantially zero by equalizing the test signal voltage on both sides of the patch cord.

Sensing units 72A and 72B sense the test signals over $R_{SENSE}$ and $R'_{SENSE}$ of the selected AXY and BXY ports, respectively, at a sensing step 412. Scanner 40 checks whether the sensed amplitudes over $R_{SENSE}$ or $R'_{SENSE}$ indicates a connected endpoint, at a sense checking step 414. If not, the scanner concludes that no endpoint is connected to the port in question, at a negative decision step 418. Otherwise, the scanner concludes that an endpoint is connected to the port (A or B, or A and B), at a positive decision step 416. The scanner updates its database accordingly, at an updating step 420.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
   in a communication system comprising endpoints, wherein each endpoint comprises a computer or a network switch and wherein the endpoints connect to one another using cable connections, injecting one or more test signals to a mid-point of a cable connection, which has first and second ends and is potentially connected to a first endpoint at the first end and to a second endpoint at the second end;
   performing one or more serial measurements, which sense a voltage that falls across an electronic component inserted in series with the cable connection at the mid-point, so as to sense the test signals; and
   based on the serial measurements, deciding which of the first and second endpoints are indeed connected to the cable connection.

2. The method according to claim 1, wherein injecting the test signals comprises applying to the cable connection an Alternating Current (AC) test signal.

3. The method according to claim 2, wherein performing the serial measurements comprises sensing the AC test signal over a resonant circuit, which is inserted in series with the cable connection and which has a resonance frequency that matches a frequency of the AC test signal.

4. The method according to claim 3, and comprising automatically estimating the resonance frequency of the resonant circuit, and setting the frequency of the AC test signal to match the estimated resonance frequency.

5. The method according to claim 2, wherein performing the serial measurements comprises performing a first serial measurement at a first port that potentially leads to the first endpoint and performing a second serial measurement at a second port that potentially leads to the second endpoint.

6. The method according to claim 5, wherein injecting the test signals comprises applying a first AC test signal to the first port and applying a second AC test signal to the second port.

7. The method according to claim 5, wherein injecting the test signals comprises applying a single AC test signal to the first port, for use in performing both the first and second serial measurements.

8. The method according to claim 1, wherein injecting the test signals comprises applying to the cable connection a Direct Current (DC) test signal.

9. The method according to claim 8, wherein performing the serial measurements comprises sensing the DC test signal over a resistance that is inserted in series with the cable connection.

10. The method according to claim 8, wherein injecting the test signals comprises applying a first DC test signal to a first port that potentially leads to the first endpoint, applying a second DC test signal to a second port that potentially leads to the second endpoint, and, when the first and second ports are patched to one another, equalizing respective voltages of the first and second DC test signals.

11. The method according to claim 1, wherein deciding which of the endpoints are connected comprises comparing respective amplitudes of the sensed test signals to a threshold.

12. The method according to claim 1, wherein deciding which of the endpoints are connected comprises distinguishing among:
  a first scenario in which the first endpoint is connected to the first end but the second endpoint is not connected to the second end;
  a second scenario in which the second endpoint is connected to the second end but the first endpoint is not connected to the first end; and
  a third scenario in which the first and second endpoints are connected to the first and second ends, respectively.

13. Apparatus, comprising:
  an interface, which is coupled to connect to a communication system comprising endpoints, wherein each endpoint comprises a computer or a network switch and wherein the endpoints connect to one another using cable connections; and
  test circuitry, which is configured to inject via the interface one or more test signals to a mid-point of a cable connection, which has first and second ends and is potentially connected to a first endpoint at the first end and to a second endpoint at the second end, to perform one or more serial measurements, which sense a voltage that falls across an electronic component inserted in series with the cable connection at the mid-point, so as to sense the test signals, and, based on the serial measurements, to decide which of the first and second endpoints are indeed connected to the cable connection.

14. The apparatus according to claim 13, wherein the test circuitry is configured to inject the test signals by applying to the cable connection an Alternating Current (AC) test signal.

15. The apparatus according to claim 14, wherein the interface comprises a resonant circuit, which is inserted in series with the cable connection and which has a resonance frequency that matches a frequency of the AC test signal, and wherein the test circuitry is configured to perform the serial measurements by sensing the AC test signal over the resonant circuit.

16. The apparatus according to claim 15, wherein the test circuitry is configured to automatically estimate the resonance frequency of the resonant circuit, and to set the frequency of the AC test signal to match the estimated resonance frequency.

17. The apparatus according to claim 14, wherein the test circuitry is configured to perform a first serial measurement at a first port that potentially leads to the first endpoint and to perform a second serial measurement at a second port that potentially leads to the second endpoint.

18. The apparatus according to claim 17, wherein the test circuitry is configured to inject the test signals by applying a first AC test signal to the first port and applying a second AC test signal to the second port.

19. The apparatus according to claim 17, wherein the test circuitry is configured to inject the test signals by applying a single AC test signal to the first port, for use in performing both the first and second serial measurements.

20. The apparatus according to claim 13, wherein the test circuitry is configured to inject the test signals by applying to the cable connection a Direct Current (DC) test signal.

21. The apparatus according to claim 20, wherein the interface comprises a resistance that is inserted in series with the cable connection, and wherein the test circuitry is configured to performing the serial measurements by sensing the DC test signal over the resistance.

22. The apparatus according to claim 20, wherein the test circuitry is configured to apply a first DC test signal to a first port that potentially leads to the first endpoint, to apply a second DC test signal to a second port that potentially leads to the second endpoint, and, when the first and second ports are patched to one another, to equalize respective voltages of the first and second DC test signals.

23. The apparatus according to claim 13, wherein the test circuitry is configured to decide which of the endpoints are connected by comparing respective amplitudes of the sensed test signals to a threshold.

24. The apparatus according to claim 13, wherein the test circuitry is configured to decide which of the endpoints are connected by distinguishing among:
  a first scenario in which the first endpoint is connected to the first end but the second endpoint is not connected to the second end;
  a second scenario in which the second endpoint is connected to the second end but the first endpoint is not connected to the first end; and
  a third scenario in which the first and second endpoints are connected to the first and second ends, respectively.

25. A keystone jack, comprising:
  a receptacle comprising at least a pair of receptacle terminals for connecting to a wire pair in a mating keystone plug;
  at least a pair of rear interconnection terminals connected to the pair of the receptacle terminals;
  a sense interface, which comprises an electronic component that is inserted in series between the pair of receptacle terminals and the pair of the rear interconnection terminals, for serially sensing at least one test signal on the wire pair by sensing a voltage that falls across the electronic component; and
  an injection interface, which is coupled to inject the at least one test signal to the wire pair on at least one respective side of the sense interface.

26. The keystone jack according to claim 25, wherein the injection interface is coupled to inject first and second test signals on respective first and second opposite sides of the sense interface.

27. The keystone jack according to claim 25, wherein the sense interface comprises a resonant circuit.

28. The keystone jack according to claim 25, wherein the sense interface comprises a resistor.

* * * * *